United States Patent

Tucci et al.

[11] 4,005,470
[45] Jan. 25, 1977

[54] TRIPLE DIFFUSED LOGIC ELEMENTS

[75] Inventors: Patrick A. Tucci, Santa Clara; Lewis K. Russell, San Jose, both of Calif.

[73] Assignee: Signetics Corporation, Sunnyvale, Calif.

[22] Filed: July 15, 1974

[21] Appl. No.: 488,754

[52] U.S. Cl. .................. 357/36; 357/40; 357/46; 307/303
[51] Int. Cl.² ..................... H01L 29/72
[58] Field of Search ........ 307/303; 357/36, 40, 357/46

[56] References Cited

UNITED STATES PATENTS

| | | | |
|---|---|---|---|
| 3,356,860 | 12/1967 | Norman | 307/88.5 |
| 3,414,783 | 12/1968 | Moore | 317/235 |
| 3,564,443 | 2/1971 | Nagata | 330/38 |

Primary Examiner—Martin H. Edlow
Attorney, Agent, or Firm—C. Richard Pfeiffer; William H. Dana

[57] ABSTRACT

In a semiconductor structure, a semiconductor body of one conductivity type having a planar surface and a first region of opposite conductivity formed in said body and extending to said surface. Spaced second, third and fourth regions of one conductivity type are formed in said first region and extend to said surface. Fifth and sixth regions of opposite conductivity are respectively formed entirely within said second and third regions and extend to said surface. In addition a seventh region of one conductivity type may be formed spaced from said second, third and fourth regions and an eighth region of opposite conductivity type formed entirely within said seventh region. A method for forming the semiconductor logic structure is also disclosed.

14 Claims, 14 Drawing Figures

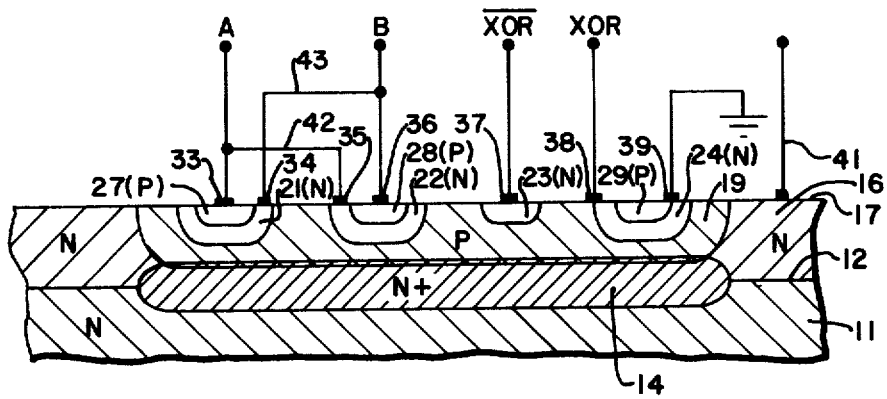
FIG.—1A
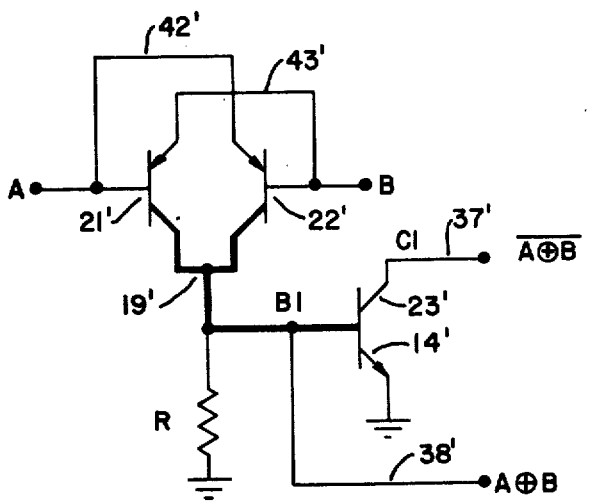
FIG.—1B
| TRUTH TABLE | | | | |
|---|---|---|---|---|
| A | B | | B1 | C1 |
| 0 | 0 | | 0 | 1 |
| 0 | 1 | | 1 | 0 |
| 1 | 0 | | 1 | 0 |
| 1 | 1 | | 0 | 1 |
FIG.—1C
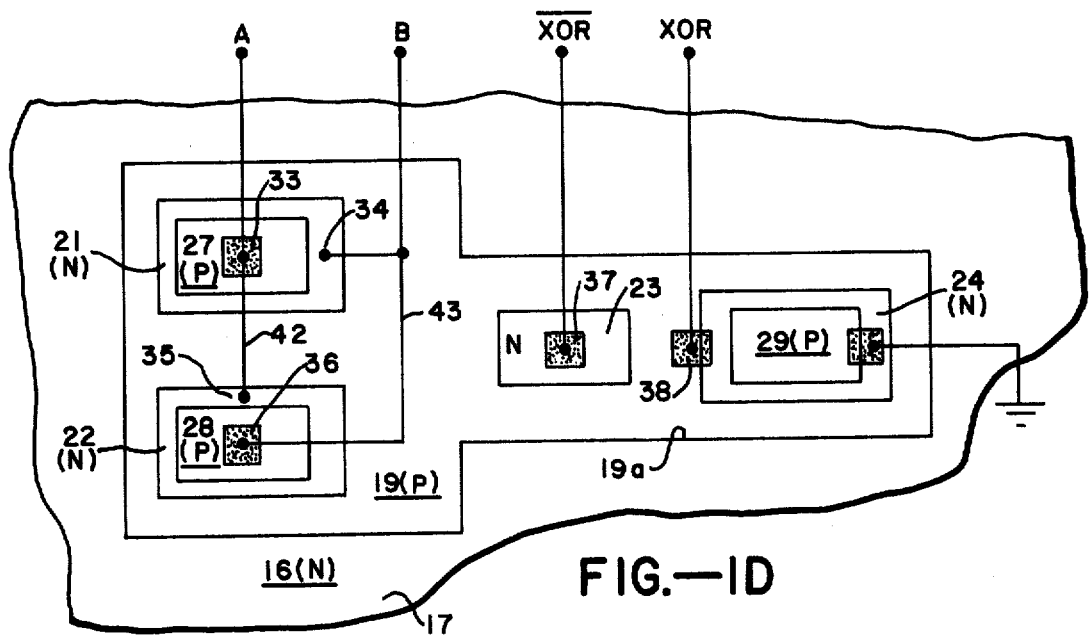
FIG.—1D

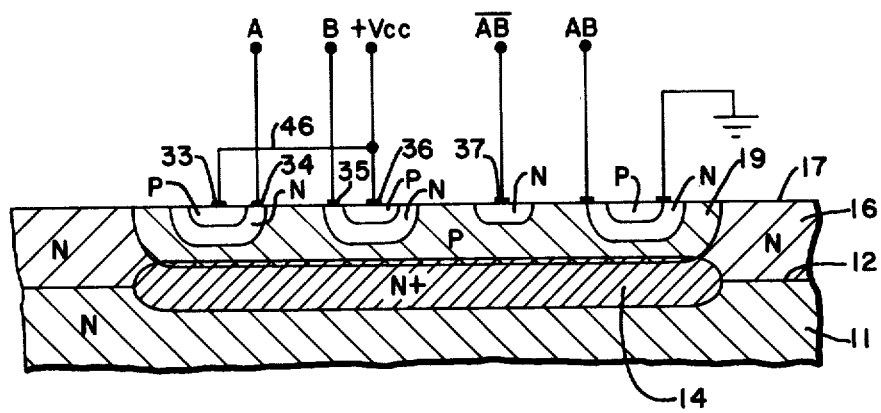
FIG.—2A
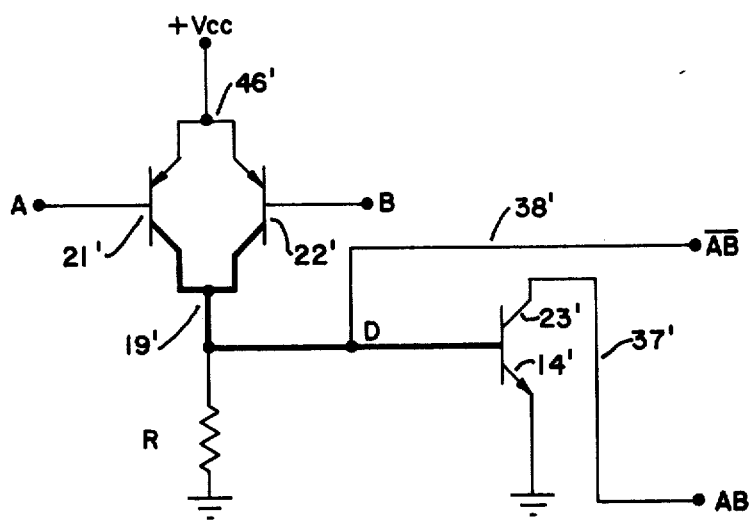
FIG.—2B
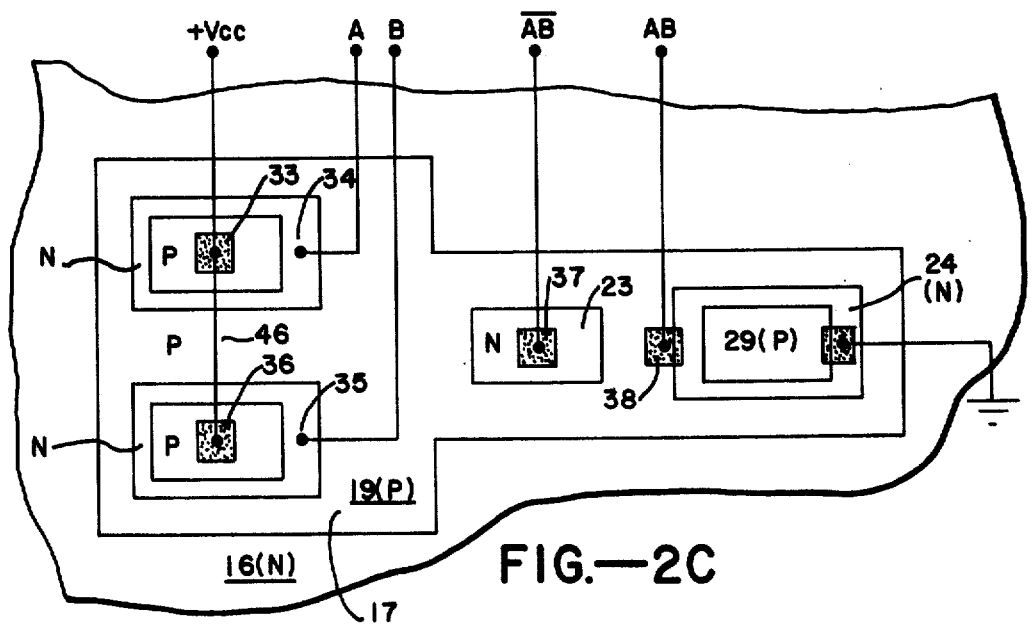
FIG.—2C

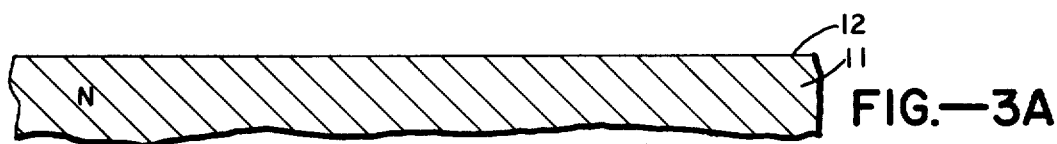
FIG.—3A
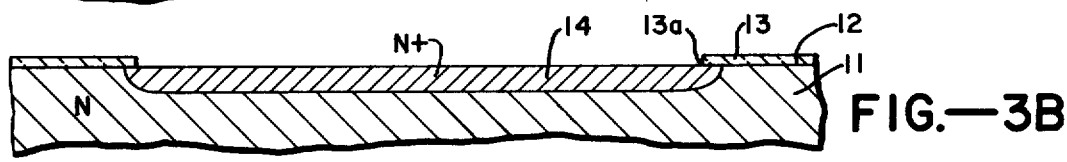
FIG.—3B
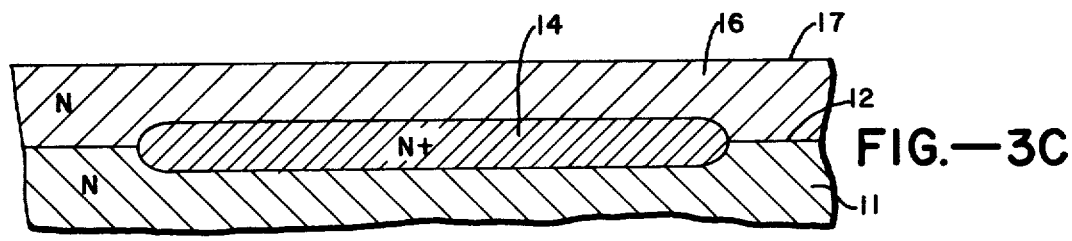
FIG.—3C
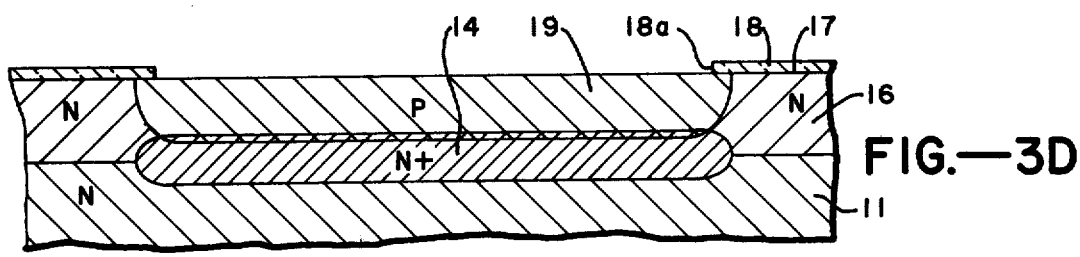
FIG.—3D
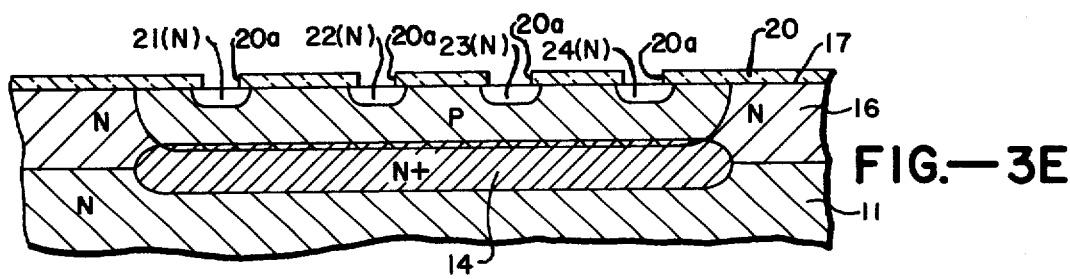
FIG.—3E
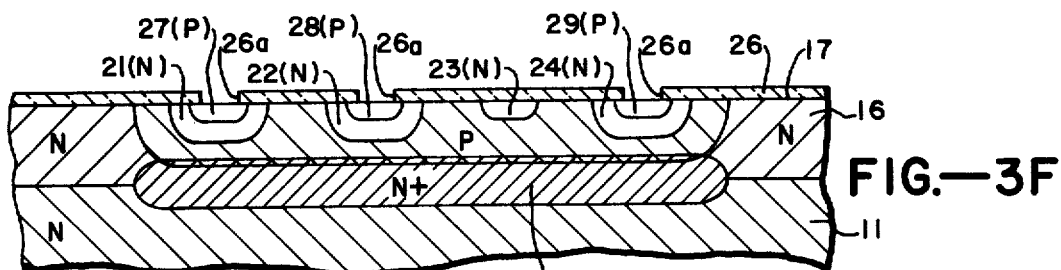
FIG.—3F
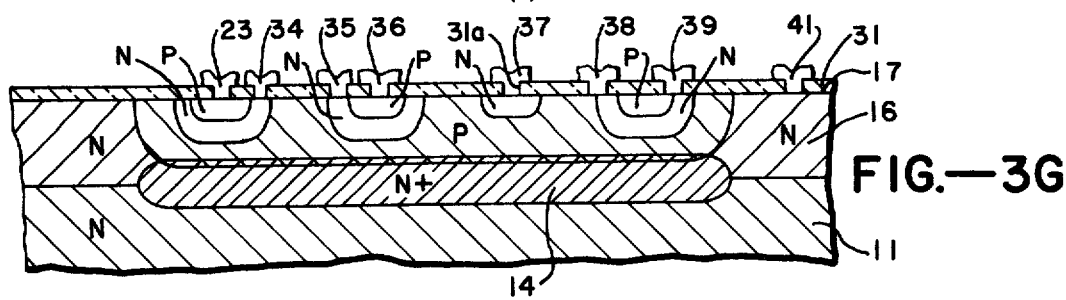
FIG.—3G

TRIPLE DIFFUSED LOGIC ELEMENTS

BACKGROUND OF THE INVENTION

This invention relates generally to a semiconductor switching structure including plural logic elements and a method for fabrication. More particularly, this invention relates to a triple diffused semiconductor switching structure including plural logic elements suitable for performing plural logic functions within a single structure.

Although semiconductor logic switching structures have heretofore been provided such structures have generally been merely the interconnection of separate elements formed within the semiconductor body. Prior art structures have generally occupied excessive portions of the semiconductor body and further have required excessive element interconnections. Thus there is a need for a semiconductor structure including plural logic elements which occupy a minimum portion of the semiconductor body.

OBJECTS AND SUMMARY OF THE INVENTION

Accordingly it is a general object of the present invention to provide an improved semiconductor structure including plural logic elements which occupies a greatly reduced portion of the semiconductor body.

It is a particular object of the present invention to provide an improved semiconductor logic structure occupying a minimum portion of the semiconductor body and having greatly simplified element interconnections.

It is a further particular object to provide a simplified method for forming plural logic elements and interconnections within a semiconductor body.

The foregoing and other objects of the invention are achieved in a semiconductor structure and method for fabrication including a semiconductor body of one conductivity type having a planar surface and a first region of opposite conductivity type formed in said body and extending to said surface, spaced second, third and fourth regions of one conductivity type formed in said first region extend to said surface, fifth and sixth regions of opposite conductivity are respectively formed entirely within said second and third regions and extend to said surface. In addition a seventh region of one conductivity type spaced from said second, third and fourth regions, and an eighth region of opposite conductivity type may be formed entirely within said seventh region.

DESCRIPTION OF THE DRAWINGS

FIG. 1A is a cross-sectional view of a portion of a semiconductor body showing the semiconductor logic structure including plural logic elements, FIG. 1B is the electrical equivalent circuit of the FIG. 1A structure. FIG. 1C is a table representation of the functions performed by the FIG. 1A structure. FIG. 1D is a top view of a portion of a semiconductor body showing an increased density layout of the FIG. 1A structure connected as an EXCLUSIVE OR logic structure.

FIG. 2A is a cross-sectional view of a portion of a semiconductor body showing plural logic elements connected as an AND logic structure, and FIG. 2B is the electrical equivalent of the FIG. 2A structure. FIG. 2C is a top view of a portion of a semiconductor body showing an increased density structure and interconnection of the FIG. 2A structure.

FIGS. 3A–G show the series of processing steps to provide the semiconductor structure including a plural logic elements.

DESCRIPTION OF THE PREFERRED EMBODIMENTS

The semiconductor structure including plural logic elements is shown in FIG. 1A and generally comprises spaced N and P regions formed in an N semiconductor body. An equivalent structure may of course be formed by substituting a P type body and interchanging the conductivities of the respective regions. The semiconductor structure includes a P type substrate having a major surface 12 and the N layer 16 formed thereon. Layer 16 has a substantially planar surface 17. An N+ region 14 is formed between layer 16 and substrate 11 and extends into said layer and into said body. A first P type region 19 is formed in layer 16 overlying and overlapping region 14 and extending to planar surface 17. Spaced second, third and fourth regions 21, 22 and 23 respectively of N conductivity type are formed in said first region 19 and extend to surface 17. Fifth and sixth regions 27 and 28 of P conductivity are respectively formed entirely within said second and third regions 21 and 22 and extend to surface 17. Although the circuitry to be described may operate by using an external resistor, a resistor may be simultaneously formed within region 19. A seventh region of N conductivity may be formed in region 19 spaced from said second, third and fourth regions and extending to said surface 17. An eighth region 29 of P type conductivity may be formed entirely within said seventh region and extending to surface 17. Plural lead means are then provided at surface 17 for coupling each of said regions exposed therein to external circuitry. Lead means 33 is coupled to region 27, means 34 to region 21, means 35 to region 22, means 36 to region 28 and lead means 37 to region 23. Lead means 38 is formed at surface 17 and overlaps the junction of region 24 and region 19 at said surface, lead means 38 coupling said regions to external circuitry. Lead means 39 is formed at surface 17 overlapping a junction of region 29 and region 24 at said surface and coupling said regions to external circuitry. An additional lead means 41 may be used to couple said semiconductor body to external circuitry. Further lead means 42 is provided for connecting means 33 and 35 and lead means 43 for connecting means 34 and 36. Thus a semiconductor logic structure is apparent including a plurality of triple diffused logic elements, which, as now may be seen, will function as an EXCLUSIVE OR logic gate.

Referring to FIG. 1B an electrical equivalent circuit of the FIG. 1A structure is shown. Each of the prime reference numbers of FIG. 1B correspond to the structural reference numbers of the FIG. 1A structure. It is further to be noted that the common shared region 19 of FIG. 1A is represented by the heavy line 19' in FIG. 1B.

Referring to FIG. 1D a top view of a structure identical to the FIG. 1A structure is shown differing only in that the regions 21, 22 and 27, 28 are placed in a side by side configuration in order to achieve increased density in the semiconductor body. in FIG. 1D it may be seen that region 19 may be formed in body 16 and extending to surface 17. Region 19 may have spaced regions 21 and 22 formed therein in a side-by-side relationship and extending to surface 17. An additional region 19 may have a sloted or necked-down portion 19a, said regions 23 and 24 being formed in said portion and spaced from each other. It is thus apparent that a plurality of the FIG. 1D structures may be alternately placed along the surface 17 of the semiconductor body wherein the necked portion 19a of one may be placed alongside the portion 19 of the adjacent structure, thereby further increasing density in a given semiconductor body.

Turning to operation, a truth table showing respective inputs at terminals A and B and outputs at terminals B1 and C1 are shown in FIG. 1C. Referring to the FIG. 1B circuit it may be seen that for first or low "0" inputs at A and B that both of the collectors of the input transistors represented by heavy line 19' remain in a low state at node B1 and accordingly the output of the inverter transistor at collector 23' remains at a high or "1" state. When either input A or input B is low and the other input high, node B1 assumes a high or 1 state and accordingly node C1 assumes a "0" state. Further when both A and B inputs are high or "1" then node B1 assumes a low or "0" state and C1 a high or "1" state. Thus it is apparent that the semiconductor structure including a plurality of logic elements functions as an EXCLUSIVE OR logic gate. Referring to FIGS. 2A-C, a NAND and AND semiconductor structure, electrical equivalent circuit and top view are respectively shown. It is to be noted that the FIG. 2A structure is similar to the structure of FIG. 1A differing only in the external interconnecting means 46 which is utilized in lieu of means 42 and 43 utilized in the FIG. 1A structure. Likewise, the electrical equivalent circuit FIG. 2B has prime reference numbers which correspond to the reference numbers of the FIG. 2A structure. Similarly, the FIG. 2C top view shows the interconnecting means 46 connected between lead means 33 and 36 and connected to $V_{cc}$ supply means and excludes the means 42 and 43 previously shown in conjunction with FIG. 1D.

Turning to operation of the FIG. 2B equivalent circuit it is to be noted that both terminal A and terminal B must go high before their respective PNP transistors will both turn off and thus permit node D to go to a second logic level or low provided at means 38' and the complement provided by NPN transistor having collector 23' to provide the complement at means 37'.

Although not shown, it is further clear that the basic semiconductor structures of FIG. 1A and 2A may further be connected as OR and NOR gates by connecting the inputs A and B separately to the respective regions 27 and 28 and providing additional interconnecting means to connect the bases 21' and 22' to ground thus biasing the PNP devices normally on and providing dual transmission gates to node D. When either of the inputs A or alternatively B goes high the associated PNP transistor transmits the high state and point D goes to a first or high state thereby providing a high output lead means 38' and via the inverter providing a low at collector 23' and lead means 37'.

Thus it is apparent that a plurality of semiconductor logic structures have been formed which are capable of performing basic logic operations. It may be seen that the EXCLUSIVE OR and the AND operations may be combined to comprise a full adder circuit. Thus the full adder, normally a complex circuit to implement in integrated injection logic or collector-up logic, may be simply configured. In addition the combination of two EXCLUSIVE OR gates, two AND gates and an OR operating combination will yield a full adder. Thus the basic circuits above discussed when combined may provide a number of semiconductor logic structures.

Turning to fabrication of the basic semiconductor logic structure as shown in FIGS. 1A and 2A, the starting material may be a P substrate 11 having a major surface 12 as shown in FIG. 3A. Next a masking layer 13 is formed on the surface 12 and an aperture 13a provided to expose a portion of surface 12, FIG. 3B. A buried region 14 is then formed in body 11 extending to surface 12 using said opening as a mask. The region may be formed of a high concentration of N impurities such as by diffusion. Next, an N type layer 16 is formed on surface 12, said layer having a planar surface 17. During the formation of the layer the buried region 14 may extend further into said layer and into said substrate as a result of the processing, FIG. 3C. Next, a masking layer 18 is formed on surface 17 and an aperture 18a formed therein to expose a portion of the surface 17. A first P type region 19 is formed in layer 16 extending to overlap a portion of N+ region 14 and extending to surface 17, FIG. 3D. Mask 18 is next removed and a masking layer 20 formed on surface 17 having spaced apertures 20a formed therein. Next spaced N type regions 21, 22, 23 and 24 are formed in region 19 extending to surface 17, FIG. 3E. Next layer 20 is removed and a layer 26 is formed on surface 17 having apertures 26a formed therein exposing portions of regions 21, 22 and 24, FIG. 3F. Next P type regions 27, 28 and 29 are formed in respective regions 21, 22 and 24, said P type regions extending to surface 17. Next layer 26 is removed and a layer 31 is formed on surface 17 having apertures 31a formed therein overlying and exposing portions of the respective regions at surface 17. Next a patterned metal layer is formed on layer 31 extending through said apertures to contact the respective regions. The metal layer is then patterned to provide lead means 33, 34, 35, 36, 37, 38, 39, and 41 contacting the respective regions and semiconductor body for coupling said regions and said body to external circuitry.

It is important to note that at this step various of the regions may be interconnected as shown in FIG. 1A, FIG. 2A or as otherwise described wherein the lead means 42 and 43, or 46 respectively may be provided by a portion of the patterned metal layer.

Thus it is apparent that there has been provided a semiconductor logic structure including a plurality of logic elements which occupy a greatly reduced portion of the semiconductor body. More particularly, an improved semiconductor logic structure has been provided occupying a minimum portion of the semiconductor body and having greatly simplified element interconnections. Further a simplified method for forming plural logic elements and interconnections within a semiconductor body has been provided.

We claim:

1. In a semiconductor logic structure, a semiconductor body of one conductivity type having a planar surface, a sole continuous first region of opposite conductivity type formed in said body and extending to said surface, spaced second, third and fourth regions of one conductivity type formed entirely within said sole continuous first region and extending to said surface, said second and third regions forming base regions, said fourth region forming a collector region in combination with said body and said first region to define a vertical transistor, fifth and sixth emitter regions of opposite conductivity respectively formed entirely within said second and third regions and extending to said surface.

2. A semiconductor structure as in claim 1 together with a seventh region of one conductivity type spaced from said second, third and fourth regions, and an eighth region of opposite conductivity type formed entirely within said seventh region.

3. A semiconductor structure as in claim 1 together with lead means for coupling said regions and said body to external circuitry.

4. A semiconductor structure as in claim 2 together with lead means for coupling said regions and said body to external circuitry.

5. A semiconductor structure as in claim 3 wherein said lead means additionally provides interconnection of said second and said sixth regions, and separately provides electrical interconnection of said third and said fifth regions.

6. A semiconductor structure as in claim 4 wherein said lead means additionally provides electrical interconnection of said second and said sixth regions and separately provides electrical interconnection of said third and said fifth regions.

7. A semiconductor structure as in claim 3 wherein said lead means additionally provides electrical interconnection of said fifth and sixth regions.

8. A semiconductor structure as in claim 4 wherein said lead means additionally electrical connection of said fifth and said sixth regions.

9. In a semiconductor structure, a semiconductor substrate of one conductivity type having a major surface, a layer of one conductivity type formed on said surface and having a planar surface, a first sole continuous region of opposite conductivity formed in said layer and extending to said planar surface, spaced second, third and fourth regions of one conductivity formed entirely within said sole continuous first region and extending to said surface, said second and third regions forming base regions, said fourth region forming a collector region in combination with said layer and said first region to define a vertical transistor, fifth and sixth emitter regions of opposite conductivity respectively formed entirely within said second and third regions and extending to said surface.

10. A semiconductor structure as in claim 9 together with a seventh region of one conductivity spaced from said second, third and fourth regions, and an eighth region of opposite conductivity formed entirely within said seventh region.

11. A semiconductor structure as in claim 10 together with lead means for coupling said region and said substrate to external circuitry.

12. A semiconductor structure as in claim 11 together with a highly doped one conductivity type region formed at the junction of said major surface of said body and said layer and generally underlying said second, third and fourth regions.

13. A semiconductor structure as in claim 12 wherein said first region extends downward from said planar surface to overlap said highly doped one conductivity type region.

14. In a method for fabrication of a semiconductor structure, providing a semiconductor body of one conductivity type having a planar surface, forming a sole continuous first region of opposite conductivity in said body and extending to said surface, simultaneously forming spaced second, third and fourth regions of one conductivity entirely within said sole continuous first region and extending to said surface, said second and third regions defining base regions, said forth region defining a collector region in combination with said body and said first region to form a vertical transistor, simultaneously forming fifth and sixth regions of opposite conductivity respectively formed entirely within said second and third regions and extending to said surface, and forming lead means carried by said planar surface for coupling said regions and said body to external circuitry said means electrically interconnecting said second and said sixth regions, and separately electrically interconnecting said third and said fifth regions.

* * * * *